United States Patent
Peltonen

(10) Patent No.: US 8,897,734 B2
(45) Date of Patent: Nov. 25, 2014

(54) STANDING WAVE RATIO METER FOR INTEGRATED ANTENNA TUNER

(71) Applicant: ST-Ericsson SA, Plan-les-Ouates (CH)

(72) Inventor: Janne Olavi Peltonen, Salo (FI)

(73) Assignee: Ericsson Modems SA, Plan-les-Ouates (CH)

( * ) Notice: Subject to any disclaimer, the term of this patent is extended or adjusted under 35 U.S.C. 154(b) by 161 days.

(21) Appl. No.: 13/664,014

(22) Filed: Oct. 30, 2012

(65) Prior Publication Data

US 2014/0120849 A1     May 1, 2014

(51) Int. Cl.
*H04B 7/00*            (2006.01)

(52) U.S. Cl.
USPC ............... 455/248.1; 455/107; 455/193.1; 343/806

(58) Field of Classification Search
CPC ................. H03H 7/40; H04B 17/0035
USPC ............ 455/248.1, 107, 193.1, 121, 169.1, 455/178.1; 343/806, 745, 702
See application file for complete search history.

(56) References Cited

U.S. PATENT DOCUMENTS

| | | | |
|---|---|---|---|
| 4,380,767 A | 4/1983 | Goldstein et al. | |
| 4,510,500 A * | 4/1985 | Brune | 343/708 |
| 6,313,644 B1 | 11/2001 | Kim | |
| 6,400,336 B1 * | 6/2002 | Gleener | 343/860 |
| 8,294,632 B2 * | 10/2012 | Skarp | 343/860 |
| 8,314,653 B1 * | 11/2012 | Granger-Jones et al. | 327/553 |
| 2002/0149535 A1 * | 10/2002 | Toncich | 343/860 |
| 2005/0085200 A1 * | 4/2005 | Toncich | 455/121 |
| 2006/0183431 A1 * | 8/2006 | Chang et al. | 455/69 |
| 2007/0035356 A1 | 2/2007 | Ranta | |
| 2009/0046030 A1 * | 2/2009 | Song et al. | 343/852 |
| 2011/0086600 A1 | 4/2011 | Muhammad | |
| 2011/0285603 A1 * | 11/2011 | Skarp | 343/860 |
| 2012/0229330 A1 * | 9/2012 | Grebennikov et al. | 342/175 |
| 2014/0071015 A1 * | 3/2014 | Zheng | 343/860 |

FOREIGN PATENT DOCUMENTS

| | | |
|---|---|---|
| EP | 0050918 A2 | 5/1982 |
| WO | 2011051554 A1 | 5/2011 |

OTHER PUBLICATIONS

Mustafa Sayginer et al: "1 8 GHz high efficiency single stage travelling wave power amplifier", Electrical and Electronics Engineering (ELECO), 2011 7th International Conference on, IEEE, Dec. 1, 2011, pp. 11-85.

* cited by examiner

*Primary Examiner* — Minh D Dao

(74) *Attorney, Agent, or Firm* — Howison & Arnott, LLP

(57) ABSTRACT

The invention provides circuitry integrated into a silicon chip that measures aspects of an RF signal on a transmission line in order to provide data that is ultimately used by an antenna tuner circuit to substantially match the impedance of the antenna with that of the transmission line providing the RF frequency to be transmitted.

19 Claims, 4 Drawing Sheets

US 8,897,734 B2

STANDING WAVE RATIO METER FOR INTEGRATED ANTENNA TUNER

TECHNICAL FIELD

The present invention relates to a standing wave ratio (SWR) meter and related circuitry that can be adapted for incorporation into an integrated circuit. In particular, embodiments of the present invention relate to transmission circuitry in a mobile device, base station or other RF transmission device wherein the transmission circuitry includes a standing wave ratio measuring circuit adapted to provide data or information that can be used to adjust the impedance seen by the transmit antenna in order to improve the antenna's impedance matching with the RF transmission line and thereby help maximize the power output of the RF transmission circuit for various transmit RF frequency channels.

BACKGROUND

Typically, the performance of a cellular antenna is far from ideal. A significant portion of a transmitter's power output is commonly reflected back from the antenna due to poor antenna impedance matching. When a single transmission frequency is transmitted via an antenna, often the antenna and the transmission line to the antenna are impedance matched to maximize the output transmit power by eliminating reflected power back from the antenna. When a transmitter is designed to transmit over a plurality of frequency channels an antenna tuner can be used to improve the antenna matching. In order to use an antenna tuning circuit, various techniques have been used to attempt to determine a proper impedance matching required to match the antenna impedance with a transmission line.

A traditional solution for determining an impedance adjustment for a transmission line that helps maximize the transmitter power output from the antenna by minimizing reflected power back from the antenna, is to measure the standing wave ratio (SWR) on the transmission line between the output of the transceiver's power amplifier and the antenna. Essentially, the SWR is a measurement of the forward and reflected power seen on the transmission line between the power amplifier and the antenna. The SWR value can be calculated from a measurement of the forward and reflected power on the transmission line.

Referring to FIG. 1, a prior art solution for helping calculate an SWR on a transmission line is shown. An RF transceiver 10 outputs a signal to be transmitted, which is input into a power amplifier 12. The power amplifier 12 amplifies the transmission signal and provides it to the transmission line 14, which ultimately provides the transmission signal to the antenna 16 for transmission. On the transmission line 14 a directional coupler 18 is traditionally used to couple with the RF signal on the transmission line 14 so as to provide a reflected power output 20 and a forward power output 22. The reflected power output 20 and forward power output 22 signals or measurements provide an indication of how much power is going forward to the antenna and how much is being reflected back. The impedance matching (antenna matching) between the antenna 16 and the output of the power amp 12 is not considered ideal if there is reflected power back from the antenna 16 on the transmission line 14. In order to help match the antenna impedance with the power amp's output impedance and the transmission line impedance, the reflected power out signal 20 and forward power out signal 22 may be utilized by other circuitry (not specifically shown) to provide a tuner control signal 24 to an antenna tuner 26. The antenna tuner may be used to adjust or change the impedance seen by the antenna 16 and the output of the power amp 12 so that there is a close matching of the impedances and thus antenna matching. When antenna matching occurs, a maximized amount of power provided by the power amp 12 will be transmitted via the antenna 16 with a minimal amount of reflected power back from the antenna 16.

A drawback of a prior art directional coupler is that it is a relatively large device and cannot be incorporated into an integrated circuit. A directional coupler is therefore more costly than an integrated circuit in that it must be manufactured and mounted on a printed circuit board. Thus, the directional coupler 18 takes up additional space within, for example a mobile telephone, where limited space is available. In addition, a directional coupler is costly to implement because it requires additional manufacturing steps and external component connections to and from various components associated with a transceiver device.

U.S. Pat. No. 4,380,767 depicts an SWR circuit 44 that uses a transformer 26 to couple with the transmission line leading to the antenna in order to provide a reflective power and forward power output. The transformer 26, like a directional coupler, is a discreet component that is rather large and cannot be integrated into a silicon chip.

What is needed is a device that can be integrated into a silicon chip and can measure the forward power and reflected power of an antenna so as to provide data that can ultimately be used by an antenna tuner circuit to help match the impedance of the antenna with that of the power amplifier at the RF frequency to be transmitted.

SUMMARY

Embodiments of the invention provide circuitry integrated into a silicon chip that measures aspects of an RF signal on a transmission line in order to provide data that is ultimately used by an antenna tuner circuit to substantially match the impedance of the antenna with that of the transmission line providing the RF frequency to be transmitted.

An embodiment of the invention provides an RF receiver circuit comprising an integrated circuit that incorporates a standing wave ratio (SWR) measuring circuit or similarly an impedance matching measuring circuit. The SWR measuring circuit comprises an artificial transmission line comprising a plurality of inductors connected in series with a plurality of nodes such that there is a node located on either side of each inductor. A first variable attenuator is connected to a first node of the plurality of nodes. The first variable attenuator is adapted to receive attenuation instructions and to attenuate a first voltage from the first node by a first stepped amount in order to provide a first attenuated voltage. A first detector circuit is connected to receive the first attenuated voltage. The first detector voltage is either zero volts or a voltage relative to the first attenuated voltage. The first detector is adapted to provide a first detected voltage. A second variable attenuator is connected to a second node of the plurality of nodes. The second variable attenuator is adapted to receive the attenuation instructions and to attenuate a second voltage from the second node by a second stepped amount in order to provide a second attenuated voltage. A second detector circuit is connected to receive the second attenuated voltage and is also adapted to provide a second detected voltage. The second detected voltage is either zero or a voltage relative to the second attenuated voltage. Furthermore, the first detected voltage and the second detected voltage are adapted to aid in determining a standing wave ratio and phase of an RF signal on the artificial transmission line. Alternatively, the first detected voltage and the second detected voltage are adapted to aid in determining a tuner control setting or signal configured to adjust a tuner control circuit to substantially match an impedance. Additionally, a controller circuit is configured to provide the attenuation instructions, to receive the first and second detected voltage and to calculate the tuner control setting therefrom.

In additional embodiments, the artificial transmission line comprises a plurality of LC delay blocks connected in series with the plurality of nodes such that there one node of the plurality of nodes located on either side of each LC delay block.

In various embodiments, the SWR measuring circuit further comprises a multiplexer (MUX) switch that is connected to receive the first detected voltage and the second detected voltage. The MUX switch is further connected to provide the first detected voltage and the second detected voltage to a controller.

In additional embodiments, the MUX switch is connected to provide the first detected voltage and the second detected voltage to the controller via an analog-to-digital converter circuit.

In other embodiments, the integrated circuit further comprises an antenna tuner circuit connected to adjust an RF transmission line impedance in accordance with the tuner control setting.

In other additional embodiments, the electrical length of the artificial transmission line is greater than ½ the wavelength of an RF signal that is intended to be transmitted by the RF transceiver circuitry and is on the artificial transmission line.

In additional embodiments, the integrated circuit comprises a power amplifier (PA) that is adapted to receive and amplify the power of an RF signal. The amplified RF signal being provided to an RF input of the SWR measuring circuit.

In further embodiments, the RF transceiver is adapted for integration into a wireless communication device, base station, user equipment (UE) or derivations thereof.

An exemplary method of measuring a standing wave ratio and a phase of an RF signal between a transmitter and an antenna of a wireless communication device is also provided. The exemplary method comprises providing an RF transmit signal to an RF input of an artificial transmission line wherein the artificial transmission line comprises a plurality of LC delay blocks connected in series with a plurality of nodes such that a node is located on either side of each LC delay. The method further comprises setting a first variable attenuator, connected to a first node of the plurality of nodes, to attenuate a first node voltage by a first stepped amount and providing a first attenuated voltage. The method also includes detecting the first attenuated voltage by a first detector and providing a first detector output, wherein the first detector output is either zero or a voltage relative to the first attenuated voltage. The method further sets a second variable attenuator, connected to a second node of the plurality of nodes, to attenuate a second node voltage by a second stepped amount and to provide a second attenuated voltage. The method further detects the second attenuated voltage using a second detector and provides a second detector output, wherein the second detector output is either zero or a voltage relative to the second attenuated voltage. The method further comprises receiving, by a controller, representations of the first detector output and representations of the second detector output. The method also includes calculating a standing wave ratio (SWR) and phase for the RF signal using the representations of the first detector output and representations of the second detector output.

In additional methods the representations of the first detector output and the second detector output are digital representations.

Additional methods further comprise providing antenna tuner data, based on the standing wave ratio and phase of the RF signal, to an antenna tuner; and adjusting transmission line impedance by the antenna tuner in order to minimize the SWR and phase shift of the RF signal between the transceiver and antenna.

Additional methods further comprise converting the first detector output and the second detector output to digital signals, by an analog to digital converter circuit, such that the digital signals are the representations of the first detector output and the second detector output.

Additional methods further comprise controlling the first stepped amount and the second stepped amount by the controller.

In yet other embodiments of the invention, an integrated circuit is provided that comprises a plurality of LC delay circuit blocks connected in series, wherein the LC delay circuit blocks form an artificial transmission line adapted to carry an RF signal. The RF signal is intended for transmission by an antenna. There is a plurality of nodes located such that a different node is located on either side of each LC delay circuit block. Each of the nodes being in a location for sensing a voltage on the artificial transmission line. Additionally, a plurality of variable attenuators are connected such that a different variable attenuator is connected to a different node of the plurality of nodes. Each attenuator is adapted or configured to attenuate a sensed voltage at different node locations and to provide an attenuated voltage output. At least one detector is provided and is adapted or configured to receive at least one attenuated voltage output and detect an attenuated voltage level. The at least one detector is further adapted or configured to provide a detected voltage output. Additionally, a multiplexer switch is connected to receive the detected voltage outputs from the at least one detector and is also adapted or configured to provide a multiplexed detected voltage output.

In other embodiments, an analog to digital converter is adapted to receive and convert the multiplexed detected voltage output into a digital data that represents voltages at the different nodes of the plurality of nodes.

In further embodiments, a power amplifier circuit is adapted to receive a signal and provide the RF signal to the input of the artificial transmission line.

In yet further embodiments, an antenna tuner circuit is connected to an output of the artificial transmission line and adapted to receive an impedance adjustment signal based from the multiplexed detected voltage output.

In yet other embodiments, the plurality of LC delay circuit blocks comprise a plurality of substantially planar inductor coils formed in two layers of silicon and adapted to have current flowing in a same general direction in flanking sides of adjacent inductor coils.

In additional embodiments, each of the variable attenuators is adapted to turn on and off and change attenuation in a step-wise manner in accordance with an attenuation control signal. Furthermore, at least one detector is also adapted to turn on and off in accordance with a detector control signal.

BRIEF DESCRIPTION OF THE DRAWINGS

The objects and advantages of embodiments of this invention will become more apparent and more easily appreciated from the following description of the exemplary embodiments of the invention, taken in conjunction with the accompanying drawings, of which.

DETAILED DESCRIPTION

Figure 1:
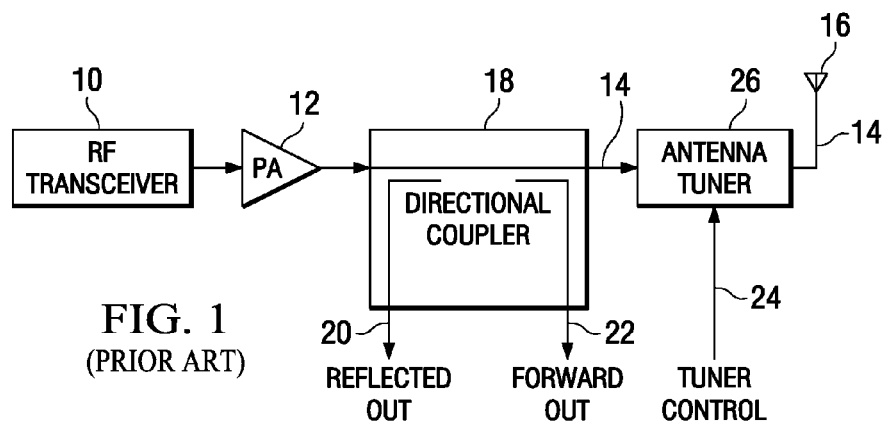
FIG. 1 is a circuit diagram of a prior art technique for determining an SWR on a transmission line.

Referring now to the drawings, wherein like reference numbers are used herein to designate like elements throughout, various views and embodiments of exemplary radio frequency transmit circuitry that include exemplary SWR measuring circuit architecture are illustrated and described. Other possible embodiments are also described. The figures are not necessarily drawn to scale and in some instances the drawings have been exaggerated and/or simplified in places for illustrative purposes only. One of ordinary skill in the art will appreciate the many possible applications and variations based on the following examples of possible embodiments.

Figure 2:
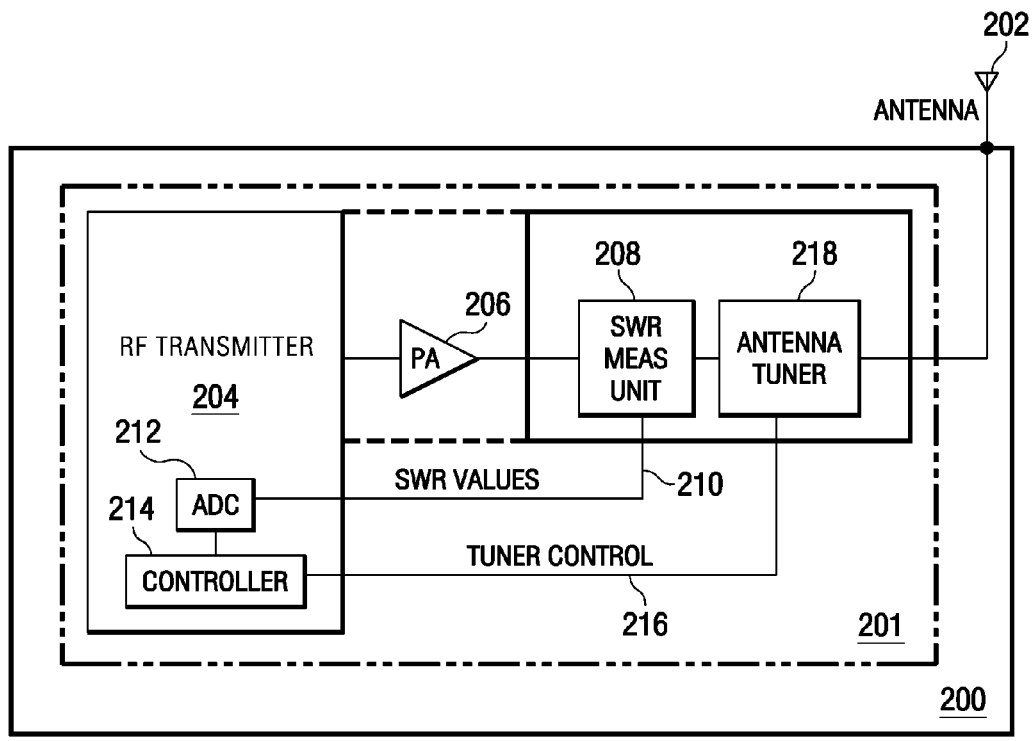
FIG. 2 is an electrical block diagram of an exemplary transmission circuit as part of an RF transceiver.

Referring to FIG. 2, an electrical block diagram of an exemplary transceiver circuit 200 is provided. A user equipment or base station device transceiver 200, incorporating an exemplary transmission circuit 201 may be adapted for connection to an antenna 202 where an RF transmission signal would be transmitted. The transmission circuit 201 may be adapted for integration into a variety of mobile communication devices or user equipment (UE). Furthermore, embodiments of an exemplary transmission circuit 201 may be incorporated into a base station or other RF transmitter device. An exemplary transmission circuit 201 has an RF transmitter circuit 204 that generates a transmission signal that is amplified by a power amplifier (PA) 206. The amplified transmission signal or PA signal is provided to an exemplary SWR measurement unit 208. The SWR measurement unit 208 determines the quality of antenna matching between the PA 206 (i.e., the transmission line) and the antenna 202. SWR values 210, measured by the SWR measuring unit 208, are provided to an analog-to-digital converter circuit (ADC) 212 where the SWR values 210 are converted to digital information and such digitized SWR values are provided to a controller 214. The controller 214 is adapted to perform data manipulation and calculations in accordance with a programmed algorithm to provide a tuner control signal to an antenna tuner circuit 218. Thus, the tuner control signal is adapted to alter the properties of the antenna tuner circuit 218 so as to substantially match the impedance of the antenna 202 with the output impedance of the PA 216 to within a predetermined antenna matching parameter. The results will help maximize the transmit power of the transmission circuit 201 and minimize the amount of power reflected back from the antenna 202.

In some embodiments an exemplary transmission circuit 201 is comprised of one or more integrated circuits. For example, the RF transceiver 204 and PA 206 may be combined as a single integrated circuit while an exemplary SWR measuring unit 208 and the antenna tuner circuit 218 may be combined as another integrated circuit. In other embodiments, the PA 206 may be in the same integrated circuit as the SWR measurement unit 208 and antenna tuner 218. The dotted lines in FIG. 2 indicate that the PA 206 may be integrated with either the RF transceiver circuit 204 or the SWR measurement unit 208 and antenna tuner 218. Additionally, it is conceivable that in some embodiments the SWR measurement unit 208 and antenna tuner 218 are incorporated into separate silicon chips or that all the elements of the transmission circuit 201 are integrated into a single integrated circuit.

Figure 3:
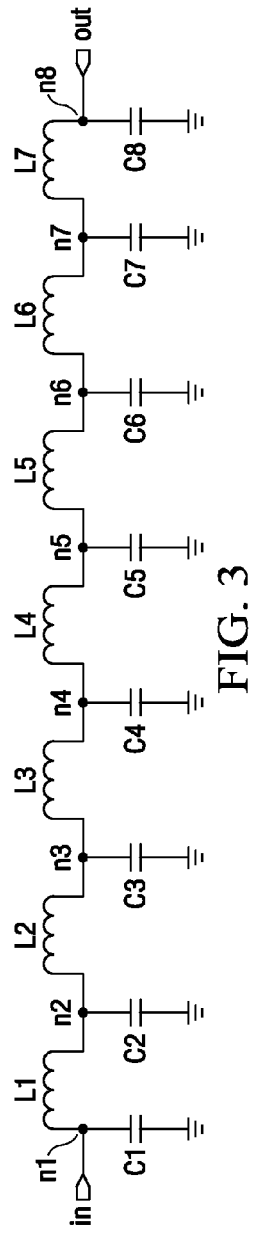
FIG. 3 is a delay line circuit.

A delay line circuit is depicted in FIG. 3. This delay line is made of a plurality of inductors (L1-L7) connected in series wherein each inductor (L1-L7) has a capacitor (C1-C8) connected to a node (n1-n8) on each side of each inductor (L1-L7). The SWR of a RF signal can be measured by using the inductor and capacitor delay line elements when they are constructed to simulate a transmission line. The delay line circuit of FIG. 3 is known as a lumped element model of a transmission line. Unique to embodiments of the invention, when an adequate number of delay elements are used, voltage measurements can be taken at, for example, the nodes n1-n8. Using these voltage measurements at nodes n1-n8, the SWR of the RF transmission signal can be calculated. Additionally, in embodiments of the invention, the inductors L1-L7, as well as the capacitors C1-C8, can all be constructed in silicon on an integrated circuit. The delay line circuit of FIG. 3 may also be referred to as an artificial LC delay line. If an RF transmitter and PA are connected to provide a transmission signal to the input side of the artificial delay line and an antenna is connected to the output side of the delay line, then ideally, the LC pairs can be selected to make the node voltages at nodes n1-n8 0 or nearly 0 volts (or flat) such that the SWR of an RF signal on this transmission line is equal to 1:1, which would indicate that there is no reflected signal back from the antenna and that there is antenna matching. The impedance ($Z_0$) and the time delay ($T_d$) for this artificial transmission line in FIG. 3 can be calculated from the LC ladder circuitry.

Figure 4:
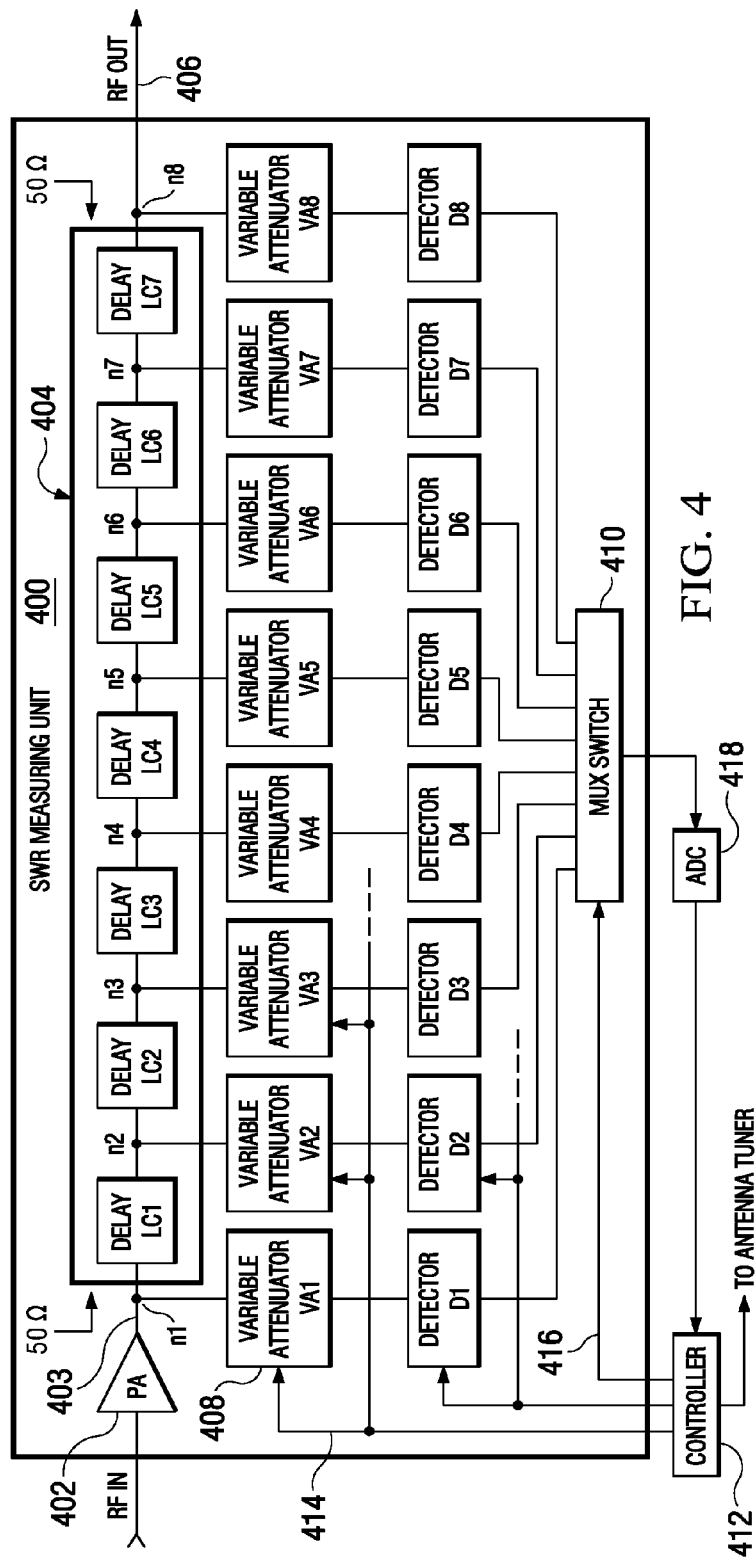
FIG. 4 is a block diagram of an exemplary SWR measuring unit.

$C_t$ is sum of all cap $Z_0 = \sqrt{L_t/C_t}$ $L_t$ is sum of all inductors $T_d = \sqrt{L_t * C_t}$ FIG. 4 depicts a block diagram of an exemplary SWR measuring unit which in some embodiments could be used as the SWR measuring unit 208 in FIG. 2. In this embodiment, a power amp 402 is incorporated into the SWR measuring unit 400 integrated circuit.

It is understood that a PA 402 may or may not be incorporated into various embodiments of an exemplary SWR measuring unit 400. The output of the PA 402 will provide an amplified signal that came from, for example, an RF transceiver 204 (see FIG. 2).

An exemplary SWR measuring unit 400 further comprises an artificial delay line 404. The artificial delay line 404 has a plurality of LC delay components (in this embodiment LC1-LC7). Embodiments of the invention may have from 2 to N LC delay components incorporated therein. Furthermore, the artificial transmission line 404 also includes a plurality of nodes n1-n8 where voltage measurements along the artificial transmission line 404 can be taken. The nodes n1-n8 are located on both sides of each LC delay component LC1-LC7. In some embodiments where a 50Ω antenna is electrically connected to the RF output 406 of the artificial transmission line, the artificial transmission line 404 will look like it has a 50Ω impedance at its output as well as at its input. Each delay sub-block LC1-LC7 creates a small signal delay in the amplified RF signal traveling down the artificial transmission line 404. The sum total of all the transmission delays of each individual delay sub-block LC1-LC7 is calculated and scaled so that the total delay or electrical delay of the artificial transmission line 404 will always be greater than one half of a wavelength of the transmission frequency or the frequency of interest.

Each node n1-n8 is connected to an input of a variable attenuator VA1-VA8, respectively. Each VA (VA1-VA8) provides an output which in turn is an input to a plurality of detector circuits D1-D8, respectively. The output of each detector circuit D1-D8 is provided as an input to a multiplexer (MUX switch) 410. In some embodiments the MUX switch 410 is an analog or RF MUX switch. In other embodiments the MUX switch 410 may be a digital MUX switch.

Each of the nodes n1-n8 are where the Vpp (voltage peak-to-peak) is to be measured along the transmission line 404. When the measured Vpp at each node n1-n8 is substantially the same (i.e., flat), then in an ideal case, there is minimal or no reflected power from the RF output at the antenna. When the antenna is mismatched with the, for example, 50Ω impedance, of the transmission line (or vis-à-vis), there will be a reflection from the antenna back through the artificial transmission line 404. The reflected power from the antenna will add with the forward power on the artificial transmission line. The addition of the forward transmission power frequency waves with the reflected frequency waves from the antenna will show up as a variation in voltages (Vpp) at the plurality of nodes n1-n8.

The exemplary inductor and capacitor components (the LC components) in each of the LC delay blocks LC1-LC7 are integrated into a silicon or IC circuit. Exemplary embodiments do not use discreet components for the inductors or the capacitors in the LC delay blocks. Having the LC components incorporated into silicon takes up very little space and is relatively inexpensive to incorporate with other components in silicon within, for example, transceivers installed or incorporated into mobile devices, base stations, portable devices or other similar equipment or derivations thereof.

When the Vpp at each node n1-n8 are not substantially the same (i.e., flat), then the minimum and maximum Vpp voltages that may be read at the intermediate nodes n1-n8 provide an indication of the amount of reflected power that is coming from a mismatched antenna, which is directly related to the standing wave ratio (SWR) that is present on the amplified RF signal transmission line. In addition to being directly related to the SWR, the waveform created on the amplified RF signal transmission line provides an indication of the phase of the reflected RF signal. The reflected phase information provides an indication as to whether the mismatched impedance is resistive, inductive and/or capacitive. The phase of the SWR signal in an artificial transmission line 404 is determined by measuring on which node(s) n1-n8 the minimum and maximum Vpp voltage is occurring as well as whether the minimum and maximum Vpp voltage remains still or is moving or rolling up and down the artificial delay line 404.

At the output of the PA 402, there is usually a significant amount of power associated with the amplified RF signal 403, which is to be transmitted by the antenna. To measure the Vpp at each node n1-n8, a variable attenuator (VA) may be used to attenuate the signal down to a level within the measuring range of an integrated circuit detector D1-D8. In an exemplary embodiment, the attenuation level setting of each variable attenuator can be individually adjusted or changed according to the power output level of the PA 402. In some embodiments the power output of the PA 402 may be adjustably controlled by a controller (not specifically shown). Each VA (VA1-VA8) has an attenuation level setting input that is adapted to receive an attenuation setting signal, which is used by circuitry within each VA to set the attenuation level in order to drop the RF signal Vpp voltage by a determined stepped amount to a level that is in a suitable range of the detector circuit electrically connected thereto. In essence, each VA VA1-VA8 can be used to increase the dynamic range of the detectors' voltage measuring capability of the SWR measuring unit 400.

From a practical perspective, the power associated with the output of the PA 402 is high and the VAs (VA1-VA8) are used to protect the detector circuitry. In principle, the VAs are not needed if the detector circuit(s) (e.g., D1-D8) can withstand the input power level.

For simplicity in this explanation, we will discuss a measurement of the Vpp voltage at node n1 via the variable attenuator VA1 and the detector D1. It should be understood that similar VPP voltage measurements are performed by similar functional circuitry at nodes n2-n8 or however many nodes are used to measure the Vpp in an exemplary embodiment. At node n1, the variable attenuator VA1 attenuates the very high powered RF signal seen at node n1 to a level that is within the operational or measurable voltage range of the detector D1. In some embodiments wherein the maximum output power of the PA is known and does not change, then the amount of attenuation required by the variable attenuator V1 for the detector D1 to measure the signal within the operational range of the detector D1 can be fairly easily determined even for a significant amount of reflected power back from an antenna. Conversely, in embodiments where the PA 402 may amplify the RF signal at various different amounts of amplification and the amount of power output from the PA is not specifically known by, for example, a controller 412 than the variable attenuator VA1 will initially be set at a highest attenuation value in order to protect its associated detector circuit D1. Then, the controller 412, in a step-wise process, decreases the attenuation setting on the variable attenuator VA1 until detector D1 provides an output indicating that it is detecting a voltage value within its dynamic range. Likewise, this process is performed by all variable attenuators VA1-VA8 and detectors D1-D8 in FIG. 4. Since embodiments include a variable attenuator, rather than a fixed attenuator, in the SWR measurement 400, the dynamic range of a, for example, 10 db detector can be extended, for example, to about 40 db merely by using and controlling the amount of attenuation provided by each variable attenuator.

In some embodiments, a detector having, for example, a fixed range of between about 10 db to about 50 db may be incorporated into an SWR measuring unit 400, but it is understood that a detector circuit having only 10 db of range is much easier to design and less expensive to implement into silicon. For example, a 10 db detector circuit designed into silicon may be as simple as comprising a diode or a rectifier detector. The dynamic range of a 10 db detector can be extended to about 40 or 50 dbs when an exemplary variable attenuator is used to attenuate a signal prior to the signal being received and detected by a detector. In other embodiments a detector may be designed into silicon having a higher range of detection, for example up to about 50 db. In such a circumstance perhaps a logarithmic amplifier, which is a bit more complex to implement in silicon than a basic diode detector, can be used as the basis for the detector circuitry. When such an exemplary logarithmic based detector is used in an embodiment of an invention in conjunction with a variable attenuator, then the dynamic range of a detector may be increased to 70 to about 100 dbs.

A digital controller 412 is connected to the variable attenuators to provide an individual attenuator control or level setting signal input 414 to each of the attenuators VA1-8. The attenuator control signal can set the amount of attenuation at each variable amplifier and set whether the variable amplifier should be on or off. The controller 412 is further connected to each of the detectors D1-D8 so as to provide a sensitivity and/or on/off signal to each of the detectors D1-D8. Additionally, the controller provides a MUX control signal to the MUX switch 410, which will be discussed below.

When an exemplary SWR measuring unit 400 is operating and sensing the Vpp voltages at the plurality of nodes n1-n8, the voltage attenuators V1-V8 are initially set at maximum attenuation. While the attenuators are set at maximum attenuation, the detectors D1-D8 may detect a voltage from the respective variable attenuator output or perhaps the delay detector will only detect zero volts. Each detector D1-D8 detects a detected voltage from the output voltage from its associated variable attenuator V1-V8. Meanwhile, the MUX switch 410 is set to receive the outputs of the detectors D1-D8 as each detector senses the detected voltage that is output from its associated variable attenuator V1-V8. The MUX switch 410, at the direction of the controller 412 provides the detected voltages output from each detector D1-D8 to an A-D converter (ADC) 418, which in turn provides the digital representations of the detected voltages as an output to the controller 412. The controller 412 can then determine whether each of the detectors D1-D8 has output a voltage that is greater than zero. If the detected voltage output by a detector is zero, then in a next step, the controller provides a signal to the detector's associated variable attenuator to decrease the attenuator by a step or a predetermined amount and then the associated detector is again read via the MUX switch 410 and the ADC 418 by the controller 412. This step-wise process continues until the controller 412 determines that each variable attenuator VA1-VA8 is operating at an attenuation setting so that the detectors D1-D8 are operating within the dynamic range to detect the Vpp node voltages n1-n8 so that the SWR and phase of the RF transmission signal can be determined.

When, via the step-wise process, each detector is operating within a range wherein there is some room for the voltage to fluctuate and still remain within the detector's operating measurement range without a need for adjusting the variable attenuator, then the controller 412 via the MUX switch 410 and ADC 418 reads the output value of each detector D1-D8 and determines the node voltage for each node n1-n8 based on the variable attenuator settings in combination with the detector's readings. In other embodiments, a controller 412 may feed the variable attenuator V1-V8 and detector D1-D8 setting values along with the detector outputs that have been converted via the ADC 418 to a digital format to another controller (not specifically shown) to calculate the reflected power, standing wave ratio and phase. In some embodiments, the controller 412 performs the reflected power, standard wave ratio, phase and impedance matching calculations. In yet other embodiments, there is no need to determine the SWR on the transmission line. Instead, since the ultimate goal for the antenna tuner 218 is to make the node voltages substantially "flat", the controller 412 or other controller may save processing energy by merely calculating a proper impedance adjustment that will make the voltages at the plurality of N-nodes substantially flat. Whichever controller (controller 412 or another controller of a microprocessor) makes the calculations, the controller then sends an antenna tuner signal to the antenna tuner block so as to adjust the transmission line impedance so that the antenna will have its impedance matched with the RF transmission line from the output of the PA 402.

In order to provide some more detail, an exemplary process for an exemplary SWR measuring unit is provided as follows. First, the SWR measuring unit may go through a process to determine how much to attenuate the output RF signal by a variable attenuator connected to each sensing node on the artificial transmission line in order for an associated detector to be able to detect the maximum and minimum Vpp node voltages at each of the plurality of nodes. From the two data points from each node n1-n8 (a maximum and minimum Vpp voltage) a calculation and/or estimation of the standing wave ratio (SWR) is made for the RF signal on the artificial transmission line. There are various well known ways to calculate the SWR from measured node voltage data and such known techniques, which can be performed by a controller, will not be discussed herein. After having estimated the SWR and the Vpp maximum and minimum magnitudes on the SWR, then the phase of the SWR can be determined by determining at which nodes the maximum and minimum power voltages occur at. Again, this calculation is well known and can be performed by a controller such as controller 412 and will not be discussed herein. After calculating or estimating the SWR and phase information (or in other embodiments, a matching impedance calculation), the transmitted RF signal interface and reflection can be easily determined at the RF out or node n8 portion of the SWR measuring unit. With this information, a controller such as controller 412, can provide information to an antenna tuner circuit, which is adapted to respond to the antenna tuner signal, and adjust the impedance seen by an antenna electrically connected to the RF output 406 or the output of the antenna tuner so that the impedance tuner of the antenna closely matches the impedance of the RF transmission line and the reflected power from the antenna is minimized.

Referring back to FIG. 2, the SWR values 210 provided by an exemplary SWR measuring unit 208 to a controller 214 via an A-D converter 212 can enable the controller 214 to provide data or information to the antenna tuner enabling the antenna tuner to adjust its impedance and/or other values such that the antenna's impedance for the particular transmission frequency is closely matched with the transmission line or output of the PA 206 such that the power reflected from the antenna 202 is substantially minimized. By minimizing the interference or reflected power on the transmission line, the output power of the transceiver and power amplifier via the antenna is maximized. When impedance seen by the antenna is matched to the RF signal output transmission line for the particular frequency being transmitted, then the ability for a communication device to transmit a substantially steady power output regardless of the transmit frequency can be accomplished without having to increase the output of a power amplifier to compensate for power reflected by an antenna that is not impedance matched for the particular transmit frequency.

Figure 5:
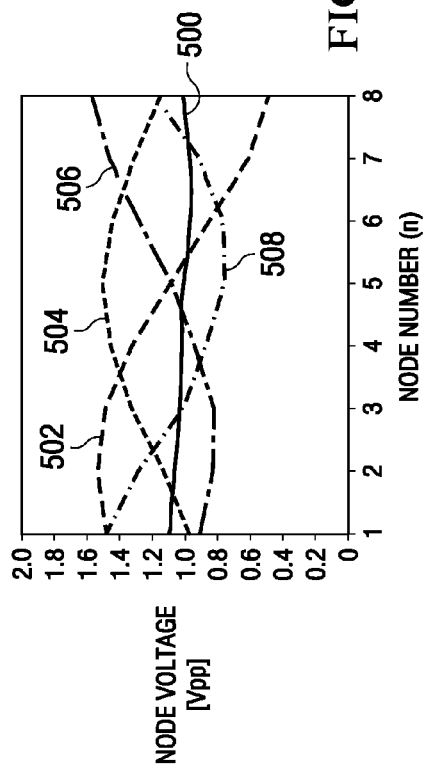
FIG. 5 is a graph depicting voltages at various nodes of an exemplary artificial transmission line.

FIG. 5 is a graph depicting voltages measured at various nodes on an exemplary artificial transmission line. Here, the load or antenna impedance was equal to 50 Ωs and the radio frequency source was providing a transmit frequency of 2 GHz with 1 Vpp. The graph shows measured node voltages at each of 8 nodes n1-n8 of an exemplary transmission line. Ideally, if an antenna or load that is connected at the RF output of an exemplary SWR measuring unit is matched with the radio frequency transceiver and power amp output circuitry then the voltage line will be straight and substantially flat on the 1 Vpp voltage level. Here, the line 500 shows a SWR reading of nodes n1-n8 of a relatively well matched transmission line wherein the Vpp is very close to having a ratio of 1:1 (i.e., the Vpp at each node is substantially flat). Graph line 500 has some variation from the "ideal" flat line due to the number of delay elements LC1-LC7 being a relatively small number, 7 in this case. The greater the number of LC elements and the number of intermediate nodes (n) that can provide measurements of voltages along the artificial transmission line, the closer an exemplary embodiment can provide data that may more closely matches the "ideal" situation.

Embodiments may have as few as 2 LC delay elements in the artificial transmission line. 2 LC delay elements can provide 3 nodes where voltage measurements can be taken to help calculate or estimate the SWR and phase of the transmission signal on the artificial transmission line. Alternatively, numerous delay circuit blocks can be incorporated into an exemplary artificial transmission line that will provide many more nodes to measure transmission line voltages from them as depicted in FIG. 4.

Additionally, the number of detector circuits can be different from the number of delay circuits. For example, there can be fewer detector circuits than there are nodes. A detector circuit may be connected to more than one node via, for example an analog switch (not specifically shown in FIG. 4). The analog switch may be positioned so as to connect the output from more than one variable attenuator to the input of a detector wherein the variable attenuators, the analog switch and the detector are all under the control of a controller circuit. This exemplary embodiment is advantageous in that the voltages of more nodes can be measured by using fewer detectors, which will decrease the overall capacitance and the overall size of the integrated circuitry within the silicon. For example, in some embodiments an exemplary SWR measuring unit can operate with only one or a few detectors that are each switched to sense the voltage for a plurality of individual nodes or attenuator outputs in an order prescribed under the control of a microcontroller.

In yet other embodiments the artificial transmission line may have more nodes than there are detector circuits but the detector circuits are connected to monitor, for example every other or every third or two adjacent nodes and then skip a node of the artificial transmission line. The reason for having a plurality of delay lines that create more nodes than those that are to have their voltages measured may be done in order to best simulate the transmission or signal line using the LC delay line blocks.

Again, referring to FIG. 5 wherein the RF infrequency 2 GHz with a 1V peak-to-peak, during each of the signal lines 502, 504, 506, and 508 depict a SWR having a ratio of 3:1. The SWR can be calculated or estimated in a variety of known ways by using the measured known voltages on the artificial transmission line wherein the exemplary artificial transmission line represents at least one half of the RF input frequencies wavelength. Furthermore, by measuring the minimum and maximum voltages measured at the nodes, the phase of the standing wave can also be determined. Here, signal 502 is 0° out of phase, signal 504 is 45° out of phase, signal 506 is 90° out of phase and signal 508 is 135° out of phase. By knowing the SWR and the phase then the mismatched load or antenna impedance can be determined. Here, for example, the mismatched impedance of the antenna for signal 502 is 16.67 Ωs; the mismatched load impedance for signal 504 is 30 Ωs and 3.2 nH; the mismatched load or antenna impedance for signal 506 is 150 Ωs; and the mismatched antenna impedance for signal 508 is 30 Ωs and 2.0 pF. In essence, embodiments use the voltage measurements at the nodes n1-n8 to provide information to a controller so that a tuner control signal can be provided to an antenna tuner so that the voltages measured at the nodes n1-n8 will become substantially similar or flat.

Referring again to FIGS. 2 and 4, it can be seen that embodiment may operate by sensing the voltages at nodes on an artificial transmission line in a manner such that the voltage of each node is attenuated by a controllable variable attenuator and then provided to a detector that provides a voltage output indicative of the node voltage being measured to a MUX switch, which per direction from a controller provides the detected node voltages measured by a plurality of detectors in an organized fashion through an AD converter and back to the controller. The controller, using the received digital encoded voltage measurements from the detectors can calculate the SWR of the transmission signal on the artificial transmission line as well as the phase of the standing wave (i.e., can calculate the impedance required to match the transmission line to the antenna to produce a substantially uniform or flat Vpp measurement at the nodes). From this information, the controller can calculate a needed impedance so that an antenna or load at the end of the transmission line will match the impedance of the transmission line so that the standing wave ratio is closer to 1:1 (see FIG. 5, signal 500) and the reflected power from the antenna or load is minimized. In some embodiments a mathematical fitting calculation may be used to enable the controller to fit the individual node voltage data points to a curve so as to help solve the SWR and phase of the transmission signal so as to calculate how to adjust the antenna tuner to match the antenna impedance.

Figure 6:
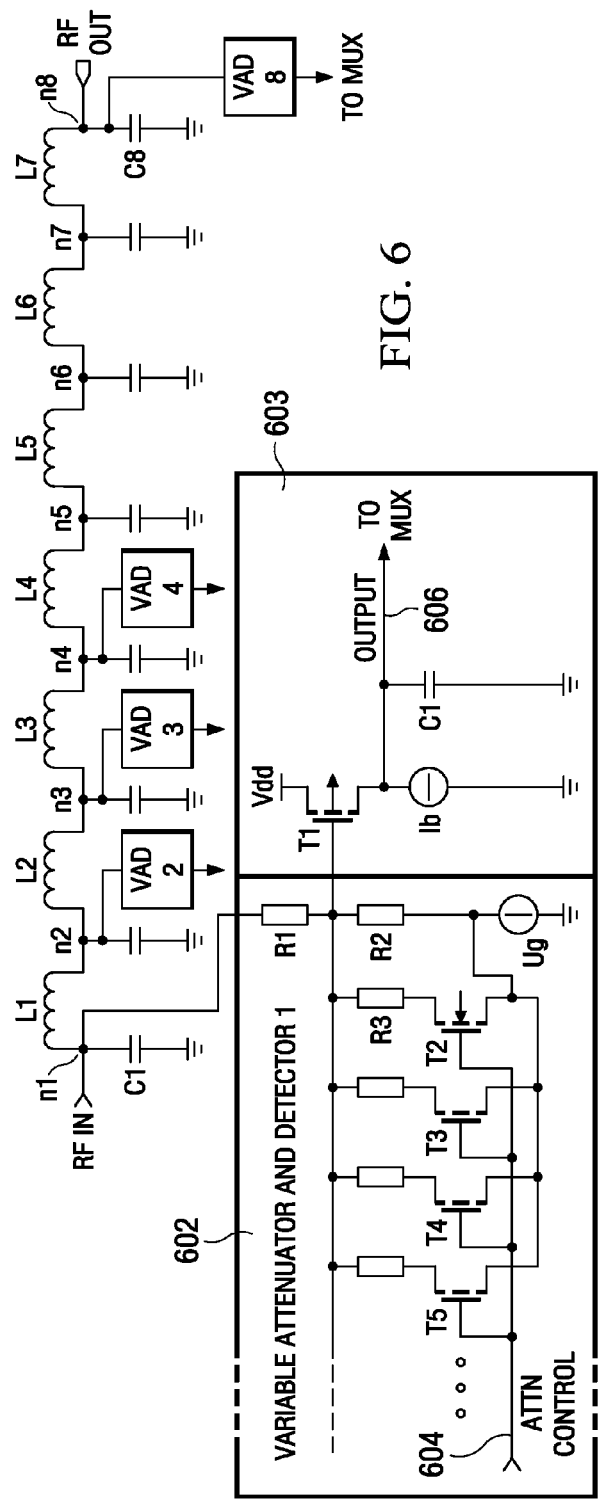
FIG. 6 is a simplified circuit diagram of a portion of an exemplary standing wave ratio measuring unit.

Referring now to FIG. 6, one possible implementation of a variable attenuator and detector circuit is depicted as being connected to node n1. For simplicity, an expanded view of a variable attenuator V1 602 and the detector D1 603 is shown. In a full circuit drawing there may be a similar circuits associated with each node n1-n8. Furthermore, for understanding purposes and simplification of the figure, the attenuator control input bus 604 is shown to only be able to control the attenuator with five attenuation settings. The variable attenuator 602 is connected to node n1 to sense the voltage there. Initially, the variable attenuator is set to a maximum attenuation wherein transistors T2, T3, T4 and T5 are all turned off in accordance with an attenuation control signal 604 from a microcontroller. The value of resistor R1 is relatively large so that the high voltage RF signal sensed at node n1 is attenuated enough so that the detector circuit 603 can sample the voltage without damaging the gate of transistor T1. Transistor T1 is biased so that when no RF signal is sensed at the base of transistor T1, the capacitor C1 will discharge to 0 volts. Thus, the output 606 of the detector 604 to a MUX will go to 0. Conversely, when there is a non-0 RF voltage signal sensed at the base of transistor T1, then T1 will charge the capacitor C1 toward $V_{DD}$ such that the circuit operates as a type of peak detector and can be designed to provide either an output voltage that is representative of the voltage sensed at node n1 to the MUX or provide a 1 or a 0 voltage to the MUX to indicate whether or not the detector is detecting a voltage. If the detector is not detecting any voltage from node n1, then the attenuation control signal 604 from the controller will turn on transistor T2, which will then place resistor R3 in parallel with resistor R2 thereby decreasing the overall resistance of the variable attenuator by one step to a predetermined amount of resistance and attenuation. Again, the RF signal is sensed at the base of the transistor T1 in the detector circuit 604 and an output is provided to the MUX, which is in-turn fed through the A to D converter and to the controller so it can be determined whether or not the detector circuit 604 has begun to sense a voltage at node n1. This process continues by decreasing the attenuation of the variable attenuator circuit 602 in a step-by-step manner. The controller, via the attenuation control signal 604 turns on additional transistors (for example, transistors T3, T4, T5, etc.) until it is determined that the detector 604 is detecting a voltage within the detector circuit's 603 workable range. This process occurs for nodes n2-n8 substantially simultaneously (or sequentially) and repetitiously until each variable attenuator and detector circuit (VAD1-VAD8) has been set so that the variable attenuator attenuates the RF signal voltage seen at its respective node is decreased until the peak detectors within the respected peak detector circuits begin to turn their respective transistor T1 on such that the peak voltage at the respective node begins to be stored on the respective C1 capacitor within the respective peak detector circuit. At this point, the detectors are operating within their operational voltage range and can be used to find and measure the minimum and maximum locations of the RF signal voltage of each node n1-n8. The MUX switch (see FIG. 4) is also controlled by the controller to sample the detector circuit's outputs so that the controller can use the minimum and maximum voltage information from each node, along with the attenuation settings of the variable attenuators to calculate the SWR and phase of the RF signal in the transmission line (i.e., to calculate an impedance to set the antenna tuner to so as to impedance match the antenna and transmission line). The controller can then provide data or instructions to an antenna tuner circuit (see FIG. 2) to enable it to adjust the impedance on the transmission line so that the antenna's impedance nearly or closely matches the transmission line resulting in minimized power reflections from the antenna back onto the transmission line and a maximized transmission power output from the antenna at the selected transmission frequency. An advantage of an exemplary design is that the variable attenuator circuitry and detector circuitry are easily replicated in a silicon IC circuit.

Integrated circuits comprising embodiments of the invention are easily incorporated into mobile devices, wireless communication devices, base station electronics and other derivations thereof in order to help maximize the transmitted power output of an antenna by determining the standing wave ratio and phase of the RF signal on the transmission line so as to calculate an adjustment to the transmission line impedance and match the mismatched antenna impedance.

Figure 7:
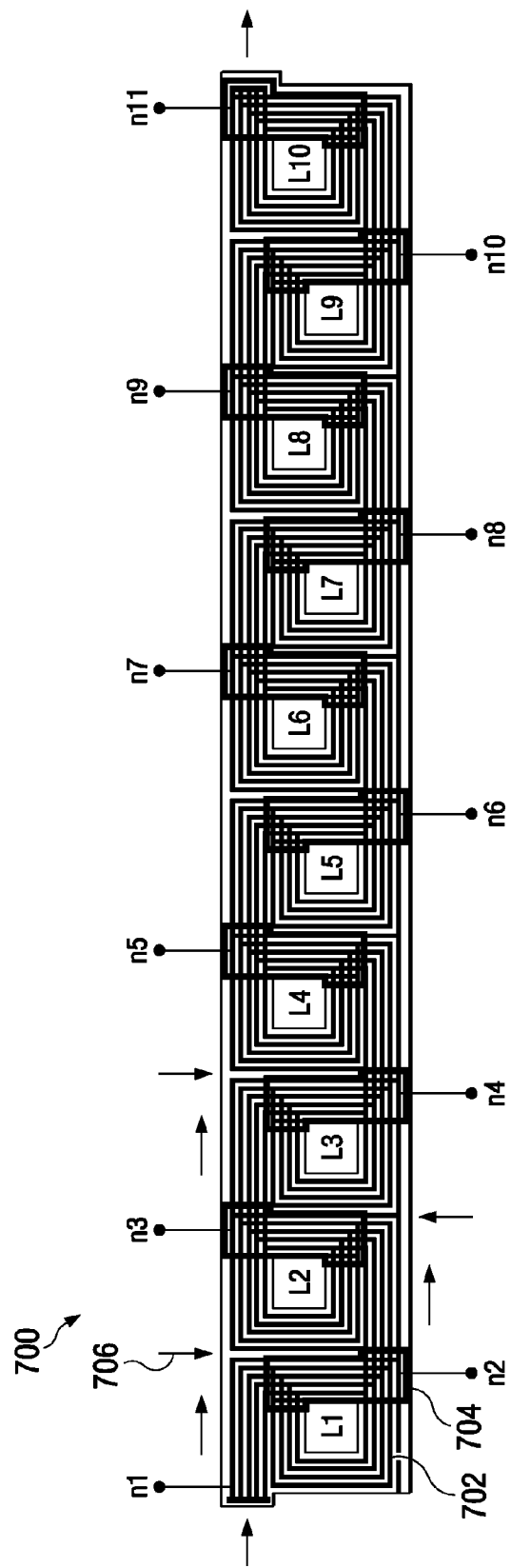
FIG. 7 is an integrated circuit layout of an exemplary inductor portion of an artificial transmission line.

Referring now to FIG. 7, an exemplary multilayer IC portion of inductors L1-L10 for use in an exemplary LC delay line or artificial transmission line is shown. Via this multilayer trace layout for an IC, multiple coils or inductors are created. The nodes n1-n11 are indicated for connecting to respective voltage attenuator and detective circuits VAD1-VAD11.

An exemplary inductor delay line can be produced in silicon using two layers of traces. A bottom layer 702 and a top layer 704. The traces produce adjacent inductors that spiral in alternating directions (i.e., clockwise, counterclockwise, clockwise . . . etc.) between each adjacent exemplary inductor is a connection for one of the n nodes, which are equally spaced along the exemplary delay line. In some embodiments each node is connected to an attenuator and detector circuit, but in other embodiments every other, every third or a sequence of adjacent nodes being connected and separated by one or more adjacent nodes not being connected to an attenuator may be created in silicon. Ideally, this exemplary inductor based delay line is used to simulate the actual transmission line between the transceivers RF output of power amplifier output and the antenna so as to aid embodiments in determining the SWR and phase of the transmission signal's reflection between the transceiver and the antenna. This exemplary coil construction 700 will be referred to herein as a worm coil or inductor. A worm inductor can produce an inductance of between 4 nH to about 7.5 nH. Each of the individual worm coils L1-L10 has its own inductance, but the proximity of each coil to the adjacent coil increases each coil's individual inductance. Currents flowing in each inductor portion that is adjacent to a next inductor flow in the same or similar direction. In other words, the current flowing in inductor L1 where inductor L1 abuts inductor L2, are flowing in the same direction as the currents in L2 as indicated by arrow 706. When the currents of two adjacent inductors are flowing in the same direction where the inductors abut each other, the capacitance is boosted thereby making each of the inductive coils have lower losses.

In other embodiments of a worm coil, the coil construction may be laid out to provide a more roundish construction using the straight line limitations of IC circuit manufacturing. Thus, the resulting worm inductive coils may be octagonal, hexagonal or shapes that are derivations thereof.

It will be appreciated by those skilled in the art having the benefit of this disclosure that this standing wave ratio measuring device provides a plurality of benefits including being able to measure forward and backward power reflected from an antenna all within a silicon device. It should be understood that the drawings and detailed description herein are to be regarded in an illustrative rather than a restrictive manner, and are not intended to be limiting to the particular forms and examples disclosed. On the contrary, included are any further modifications, changes, rearrangements, substitutions, alternatives, design choices, and embodiments apparent to those of ordinary skill in the art, without departing from the spirit and scope hereof, as defined by the following claims. Thus, it is intended that the following claims be interpreted to embrace all such further modifications, changes, rearrangements, substitutions, alternatives, design choices, and embodiments.

What is claimed is:

1. RF transmission circuitry comprising:
an integrated circuit comprising an impedance matching measuring circuit, the impedance matching measuring circuit comprising:
an artificial transmission line comprising a plurality of inductors connected in series with a plurality of nodes such that there is a node located on either side of each inductor;
a first variable attenuator connected to a first node of the plurality of nodes, the first variable attenuator being adapted to receive attenuation instructions and to attenuate a first voltage from the first node by a first stepped amount to provide a first attenuated voltage;
a first detector circuit connected to receive the first attenuated voltage, the first detector adapted to provide a first detected voltage, the first detected voltage being either zero or a voltage relative to the first attenuated voltage;
a second variable attenuator connected to a second node of the plurality of nodes, the second variable attenuator being adapted to receive the attenuation instructions and to attenuate a second voltage from the second node by a second stepped amount to provide a second attenuated voltage;
a second detector circuit connected to receive the second attenuated voltage, the second detector adapted to provide a second detected voltage, the second detected voltage being either zero or a voltage relative to the second attenuated voltage;
wherein the first detected voltage and the second detected voltage are adapted to aid in a determination of a tuner control setting adapted to substantially match an impedance;
a controller configured to provide the attenuation instructions, receive the first and second detected voltage, and calculate the tuner control setting therefrom.

2. The RF transceiver circuitry of claim 1, wherein the artificial transmission line comprises a plurality of LC delay blocks connected in series with the plurality of nodes such that there one node of the plurality of nodes located on either side of each LC delay block.

3. The RF transceiver circuitry of claim 1, wherein the impedance matching measuring circuit further comprises a MUX switch that is connected to receive the first detected voltage and the second detected voltage; the MUX switch is further connected to provide the first detected voltage and the second detected voltage to a controller.

4. The RF transceiver circuitry of claim 3, wherein the MUX switch is connected to provide the first detected voltage and the second detected voltage to the controller via an analog-to-digital converter circuit.

5. The RF transceiver circuitry of claim 1, wherein the integrated circuit further comprises an antenna tuner circuit connected to adjust an RF transmission line impedance in accordance with the tuner control setting.

6. The RF transceiver circuitry of claim 1, wherein the electrical length of the artificial transmission line is greater than ½ a wavelength of an RF signal on the artificial transmission line.

7. The RF transceiver circuitry of claim 1, wherein the integrated circuit further comprises a power amplifier (PA) that is adapted to receive and amplify the power of an RF signal, the amplified RF signal being provided to an RF input of the impedance matching measuring circuit.

8. The RF transceiver of claim 1, wherein the RF transceiver is configured for integration into a wireless communication device or a base station.

9. A method of measuring a peak-to-peak voltages (Vpp) of an RF signal at various locations on an artificial transmission line between a transmitter and an antenna of a wireless communication device; the method comprising:
provided an RF transmit signal to an RF input of the artificial transmission line wherein the artificial transmission line comprises a plurality of LC delay blocks connected in series with a plurality of nodes such that a node is located on either side of each LC delay;
setting a first variable attenuator, connected to a first node of the plurality of nodes, to attenuate a first node voltage by a first stepped amount and providing a first attenuated voltage;
detecting the first attenuated voltage by a first detector and providing a first detector output, the first detector output being either zero or a voltage relative to the first attenuated voltage;
setting a second variable attenuator, connected to a second node of the plurality of nodes, to attenuate a second node voltage by a second stepped amount and providing a second attenuated voltage;
detecting the second attenuated voltage by a second detector and providing a second detector output, the second detector output being either zero or a voltage relative to the second attenuated voltage;
receiving by a controller representations of the first detector output and the second detector output; and
calculating an impedance adjustment using the representations of the first detector output and the second detector output.

10. The method of claim 9, wherein the representations of the first detector output and the second detector output are digital representations.

11. The method of claim 9, further comprising:
providing antenna tuner data, based on the calculated impedance adjustment, to an antenna tuner; and
adjusting a transmission line impedance by the antenna tuner in order to minimize the SWR and phase shift of the RF signal between the transceiver and antenna.

12. The method of claim 9, further comprising converting the first detector output and the second detector output to digital signals by an analog to digital converter circuit such that the digital signals are the representations of the first detector output and the second detector output.

13. The method of claim 9, further comprising controlling the first stepped amount and the second stepped amount by the controller.

14. An integrated circuit comprising:
a plurality of LC delay circuit blocks connected in series, the LC delay circuit blocks forming an artificial transmission line adapted to carry an RF signal, the RF signal being intended for transmission by an antenna;
a plurality of nodes located such that a different node is located on either side of each LC delay circuit block, each node being a location for sensing a voltage on the artificial transmission line;
a plurality of variable attenuators connected such that a different variable attenuator is connected to a different node of the plurality of nodes, each attenuator is configured to attenuate a sensed voltage at the node and to provide an attenuated voltage output;
at least one detector configured to receive at least one attenuated voltage output and detect an attenuated voltage level, the at least one detector is further configured to provide a detected voltage output; and
a multiplexer switch connected to receive the detected voltage outputs from the at least one detector and configured to provide a multiplexed detected voltage output.

15. The integrated circuit of claim 14, further comprising an analog to digital converter adapted to receive and convert the multiplexed detected voltage output into a digital data that represents voltages at the different nodes of the plurality of nodes.

16. The integrated circuit of claim 14, further comprising a power amplifier circuit adapted to receive and provide the RF signal to the input of the artificial transmission line.

17. The integrated circuit of claim 14, further comprising;
an antenna tuner circuit connected to an output of the artificial transmission line and adapted to receive an impedance adjustment signal based from the multiplexed detected voltage output.

18. The integrated circuit of claim 14, wherein the plurality of LC delay circuit blocks comprise a plurality of substantially planar inductor coils comprising two layers of silicon circuitry and adapted to have current flowing in a substantially similar general direction in flanking sides of adjacent inductor coils.

19. The integrated circuit of claim 14, wherein each of the variable attenuators is adapted to turn on and off and to change attenuation in a step wise manner in accordance with an attenuation control signal; and wherein the at least one detector is adapted to turn on and off in accordance with a detector control signal.

* * * * *

UNITED STATES PATENT AND TRADEMARK OFFICE
CERTIFICATE OF CORRECTION

PATENT NO. : 8,897,734 B2
APPLICATION NO. : 13/664014
DATED : November 25, 2014
INVENTOR(S) : Janne Olavi Peltonen It is certified that error appears in the above-identified patent and that said Letters Patent is hereby corrected as shown below:

In the Claims

In Claims 2-8, please delete "RF transceiver circuitry" and insert therefor --RF transmission circuitry--.

Signed and Sealed this
Seventh Day of July, 2015

Michelle K. Lee
*Director of the United States Patent and Trademark Office*